US012648089B2

(12) United States Patent　　(10) Patent No.:　US 12,648,089 B2

Patel　　(45) Date of Patent:　Jun. 2, 2026

(54) REMOTE DRIVER CONTROL CENTER

(71) Applicant: Infinilux Corporation, Carson, CA (US)

(72) Inventor: Jitendra B. Patel, Rolling Hills Estates, CA (US)

(73) Assignee: INFINILUX CORPORATION, Carson, CA (US)

( * ) Notice: Subject to any disclaimer, the term of this patent is extended or adjusted under 35 U.S.C. 154(b) by 221 days.

(21) Appl. No.: 17/833,891

(22) Filed: Jun. 6, 2022

(65) Prior Publication Data

US 2023/0156931 A1　　May 18, 2023

Related U.S. Application Data

(60) Provisional application No. 63/197,326, filed on Jun. 4, 2021.

(51) Int. Cl.
  *H05K 5/00*　　　(2025.01)
  *H05K 5/02*　　　(2006.01)

(52) U.S. Cl.
  CPC ........... *H05K 5/003* (2013.01); *H05K 5/0217* (2013.01); *H05K 5/0247* (2013.01)

(58) Field of Classification Search
  CPC ..................................................... G06F 1/181
  See application file for complete search history.

(56) References Cited

U.S. PATENT DOCUMENTS

| | | | | |
|---|---|---|---|---|
| 2004/0196651 A1* | 10/2004 | Newbold | .................. | F21S 2/00 |
| | | | | 362/133 |
| 2005/0018388 A1* | 1/2005 | Shih | ........................ | G06F 1/181 |
| | | | | 361/679.02 |
| 2008/0025002 A1* | 1/2008 | Hendrix | .................. | G06F 1/181 |
| | | | | 312/223.2 |

* cited by examiner

*Primary Examiner* — Jerry Wu

(74) *Attorney, Agent, or Firm* — ORBIT IP, LLP

(57) ABSTRACT

An improved modular remote driver control center is provided.

2 Claims, 10 Drawing Sheets

28

Special installation tool, 1.5mm Allen wrench handle
70

28                                46

70
Approx 3 lbs force required to depress for wire insertion

115

REMOTE DRIVER CONTROL CENTER

CROSS-REFERENCE TO RELATED APPLICATION

This application claims the benefit of U.S. Provisional Application No. 63/197,326, filed Jun. 4, 2021, which is hereby incorporated by reference in its entirety and is considered a part of this specification.

FIELD

The present patent document relates generally to remote driver control centers for use in lighting systems.

BACKGROUND

In typical LED lighting environments, it is common to have a remote driver control center (or RDCC) that provides individual power lines to service each light. For example, in LED lighting configurations employed in a warehouse or other large facility, such as a data storage facility, a large number of lights require both power and control. Depending on the size of the facility and the number of light fixtures, one or more remote driver control centers are used to provide the power to light fixtures. Each remote control driver center may have an normal side and an emergency side. The normal side receives normal mains power and distributes DC power to attached light fixtures during normal operation, and the emergency side receives emergency mains power (such as from a generator) and distributes DC power to a limited subset of the light fixtures attached to the RDCC in the event of a normal mains power failure.

One example of a prior RDCC 28 of Applicant is shown in FIGS. 1-3. In FIG. 1, the RDCC 28 is shown from a front view with its cover removed. The RDCC 28 shown in FIG. 1 is for providing normal and emergency power to lighting fixtures. In the illustrated embodiment, the RDCC is provided with two Emergency Lighting Control Units ("ELCUs") 30, 32.

As shown in FIG. 1, the RDCC 28 has a housing 34 with separate compartments 36, 38 for normal and emergency power supply circuitry, respectively. The compartment 36 for normal power supply includes a controller 40, eleven (11) AC to DC normal power supplies 42, and four (4) terminal blocks (namely, a normal AC power distribution block 44 with AC in and out, a normal power dimming wires distribution block 46 with DC in and out, a normal power supply distribution block 48 with AC in and out, and a normal power LED light fixture distribution block 50 with DC in and out). The controller 40 can be, for example, a triple load Legrand Wattstopper® controller.

The compartment 38 for emergency power supply includes two ELCUs 30, 32, six (6) AC to DC emergency power supplies 52, and four (4) terminal blocks (namely, an emergency power distribution block 54 with AC in and out, an emergency power LED light fixture distribution block 56 with DC in and out, an emergency power dimming wires distribution block 58 with DC in and out, and an emergency power supply distribution block 60 with AC in and out).

AC power is received at the normal AC power distribution block 44. This AC power is then routed to the normal controller 40, such as a triple load Wattstopper® LMRC-213-M controller. The controller 40 then outputs AC power on three circuits, the load A circuit, the load B circuit, and the load C circuit. The load A, B, and C circuit outputs from the controller 40 are then routed to the normal power supply distribution block 48. The normal power supply distribution block 48 receives the AC power provided on the load A, B, and C circuits and distributes it to the eleven (11) power supply drivers 42 to convert AC to DC power such that the load A circuit is connected to power supplies 1-4, the load B circuit is connected to power supplies 5-8, and the load C circuit is connected to power supplies 9-11.

The DC power output from the 11 normal power supply drivers 42 is routed to the normal LED light fixture distribution block 50. Each normal power supply 42 is designed to power a single light fixture. Thus, for each of the 11 power supplies 42 attached to the normal LED light fixture distribution block 50, a two wire cable may be connected to the normal LED light fixture distribution block 50 and fed out of the RDCC 28 to provide DC power to a low voltage DC light fixture and a return circuit to the RDCC 28.

The normal controller 40 also provides a dimming control signal for the load A, load B, and load C circuits using a standard 0 to 10 V DC voltage control signal. Each of these dimming control signals from the normal controller 40 is connected to the normal power dimming wires distribution block 46. The load A dimming control signal is then distributed via the normal power dimming wires distribution block 46 and appropriate connecting wires to normal power supplies 1-4. Similarly, the load B and load C dimming control signal are distributed via the normal power dimming wires distribution block 46 and appropriate connecting wires to normal power supplies 5-8 and normal power supplies 9-11, respectively.

On the emergency power side of the RDCC 28, emergency AC power is received at the emergency AC power distribution block 54. This AC power is then routed to the Emergency Power "line in" ports of each of the emergency controllers 30, 32, which may, for example be Wattstopper® ELCU-100 controllers. The emergency AC power is then routed from each of the ELCU units 30, 32 to the emergency power supply distribution block 60. A normal AC power switching line is routed from the load A portion of the normal power supply distribution block 48 to the "switch in" port of emergency controller 30, and a normal AC power switching line is routed from the load B portion of the normal power supply distribution block 48 to the "switch in" port of the other ELCU 32. As a result, during normal operation, the emergency power provided by ELCU 30 on its "line out" port is switched on and off with the normal load A circuit driven lights and the emergency power provided by the other ELCU 32 on its "line out" port is switched on and off with the normal load B circuit driven lights.

The emergency power supply distribution block 60 receives the AC power from each ELCU unit 30, 32 and then distributes the emergency power from the ELCU 30 switched by load A of the normal circuit to emergency power supplies 12-14 and distributes the emergency power from the ELCU 32 switched by load B of the normal circuit to emergency power supplies 15-17. The six emergency power supply drivers 52 convert the received AC power to DC power. The DC power output from the 6 emergency power supply drivers 52 is routed to the emergency LED light fixture distribution block 56.

Each emergency power supply 52 is designed to power a single light fixture. Thus, for each of the 6 emergency power supplies 52 attached to the emergency LED light fixture distribution block 56, a two-wire cable may be connected to the emergency LED light fixture distribution block 56 and fed out of the RDCC 28 to provide DC power to a low voltage DC emergency light fixture and a return circuit to the RDCC 28.

The ELCUs 30, 32 provide all the required functionality to allow any standard lighting controller 40 to control emergency lighting in conjunction with normal lighting in any area within a building. Each ELCU 30, 32 monitors a single circuit that provides normal lighting to an area. As long as normal power is present, the ELCUs 30, 32 permit lighting control devices (i.e., occupancy sensors, panels, dimmers, or wall switches) to control the emergency lighting fixtures as well as the general lighting. If power is lost for any reason, however, including the tripping of a single branch circuit breaker, the ELCU will force the emergency fixtures for that area on. The ELCUs 30, 32 can be wired either as a control device, so that emergency lighting follows the control of normal lighting, or as a bypass device to shunt emergency power around a control device when normal power fails.

By wiring the ECLUs 30, 32 in this manner, during normal operation, half of the emergency lights are slaved on and off in conformance to the state of the power supplies and lights driven by the normal load A circuit and half by the state of power supplies and lights driven by the normal load B circuit of the normal controller 40. Further, during normal operation, the normal controller 40 also provides dimming capabilities to the emergency lights using a standard 0 to 10 V DC voltage control signal. The load A and load B dimming control signal from the normal controller 40 for the load A and load B circuits are communicated from the controller 40 to the emergency power dimming wires distribution block 58. The load A and load B dimming control signals are then distributed via the emergency power dimming wires distribution block 58 and appropriate connecting wires to emergency power supplies 12-14 and 15-17, respectively, so that during normal operation, the emergency power supplies are dimmed in accordance with the lights connected to the normal load A and B circuits, respectively.

Should the ELCUs 30, 32 sense a loss of power on the normal side of the control center 28, then they will automatically force the emergency light fixtures connected to emergency power supplies 12-17 to the on state. On the other hand if ECLU 30 senses a loss of power on the normal side, then ECLU 30 will force the emergency light fixtures connected to emergency power supplies 12-14 to the on state. Similarly if ECLU 32 senses a loss of power on the normal side, then ECLU 32 will force the emergency light fixtures connected to emergency power supplies 15-17 to the on state.

A number of problems exist with the RDCC 28. For example, as illustrated in FIG. 1, it requires a complex wiring scheme that is not hidden from view. Further, if the housing 34 is damaged, the entire RDCC must be returned due to the complicated wiring of the system, which makes field repairs difficult if not impractical. The same is true if one or more of the normal side power supplies 42 or emergency side power supplies should fail during use.

Furthermore, the terminal blocks employed in RDCC 28 require a special installation tool 60, as best seen in FIGS. 2 and 3 to depress one of the terminals within a terminal block to allow for the insertion or removal of a wire from the terminal. Installation tool 60 as shown in FIGS. 2 and 3 is a 1.5 mm Allen wrench with a handle. When a wire is to be inserted or removed from a terminal of one of the terminal blocks, such as terminal block 46, tool 60 is required to manipulate one the terminals within a terminal block by applying a approximately 3 lbs. force to open the terminal to allow proper insertion or removal of a wire therefrom.

SUMMARY

The present patent document describes a next generation remote driver control center (RDCC), which may provide for individually and/or collectively a number of advantages. For example, the RDCC of the present patent document may provide improved wiring, which provides for easier serviceability for any warranty repairs, as well as a cleaner appearance when the cover is removed. In addition, the RDCC of the present patent document may provide improved manufacturing and production efficiency, with reduced wiring errors. The RDCC of the present patent may also permit toolless field repairs, including without the special tool 60, as well as easier production that will mitigate worker hand fatigue.

One object of the RDCC of the present patent document is to provide an RDCC that has an easier standardized platform that provides modularity on the production floor. An additional object of the RDCC of the present patent document is to provide an RDCC that enables correction of any load assignment errors in the field without any special tools. It is a further object of another aspect of the present patent document to provide a hot swappable power supply quick release feature that will allow for rapid power supply replacement without powering off the RDCC.

Further aspects, objects, desirable features, and advantages of the various inventions that are the subject of the present disclosure will become manifest and be better understood from the following description considered in connection with accompanying drawings in which various embodiments of the disclosed inventions are illustrated by way of example. It is to be expressly understood, however, that the drawings are for the purpose of illustration only and are not intended as a definition of the limits of any of the disclosed inventions.

5 emergency power LED light fixture distribution block 56 of Applicant's first generation RDCC.

Figure 1:
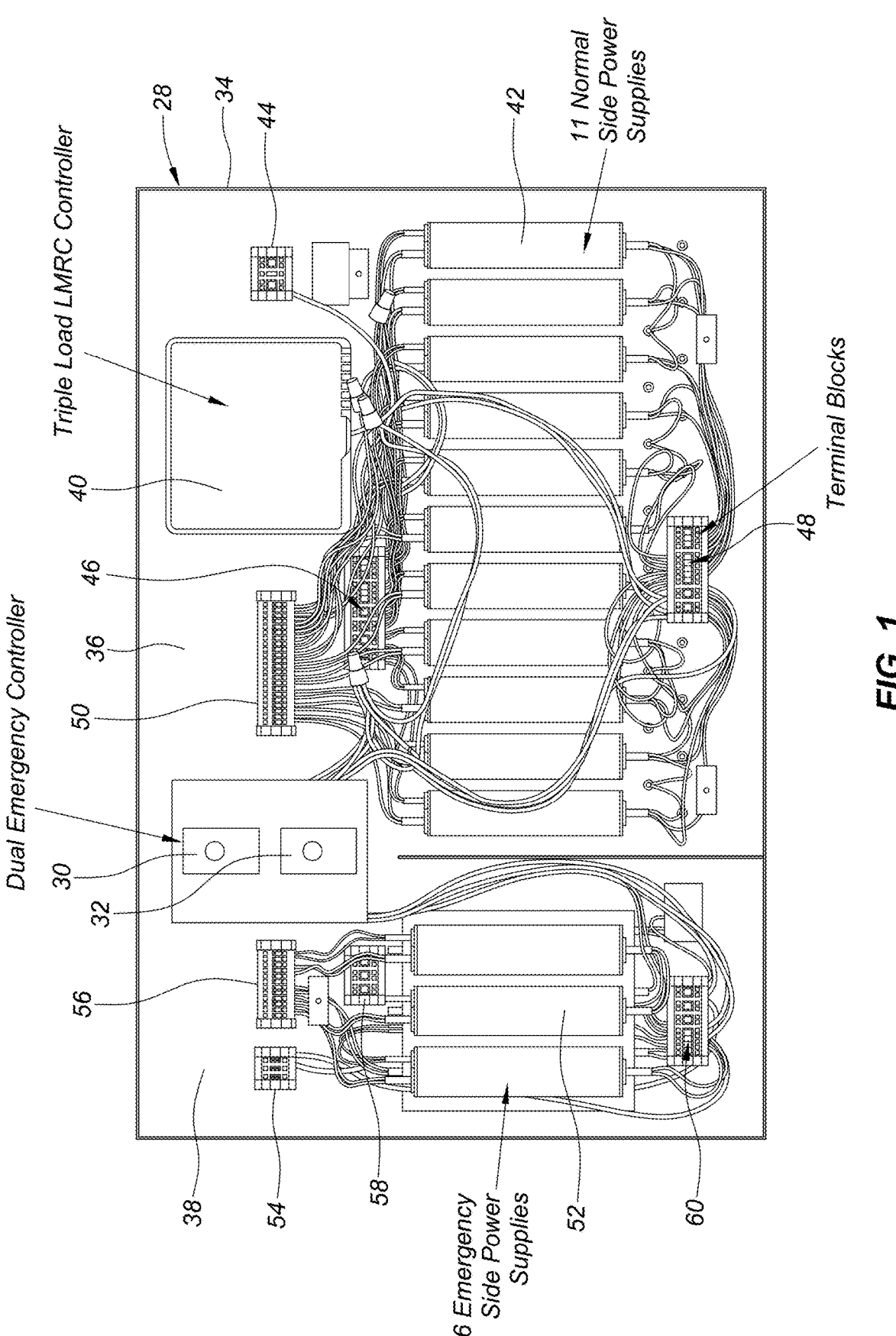
FIG. 1 illustrates a prior remote driver control center of the Applicant's.
Figure 2:
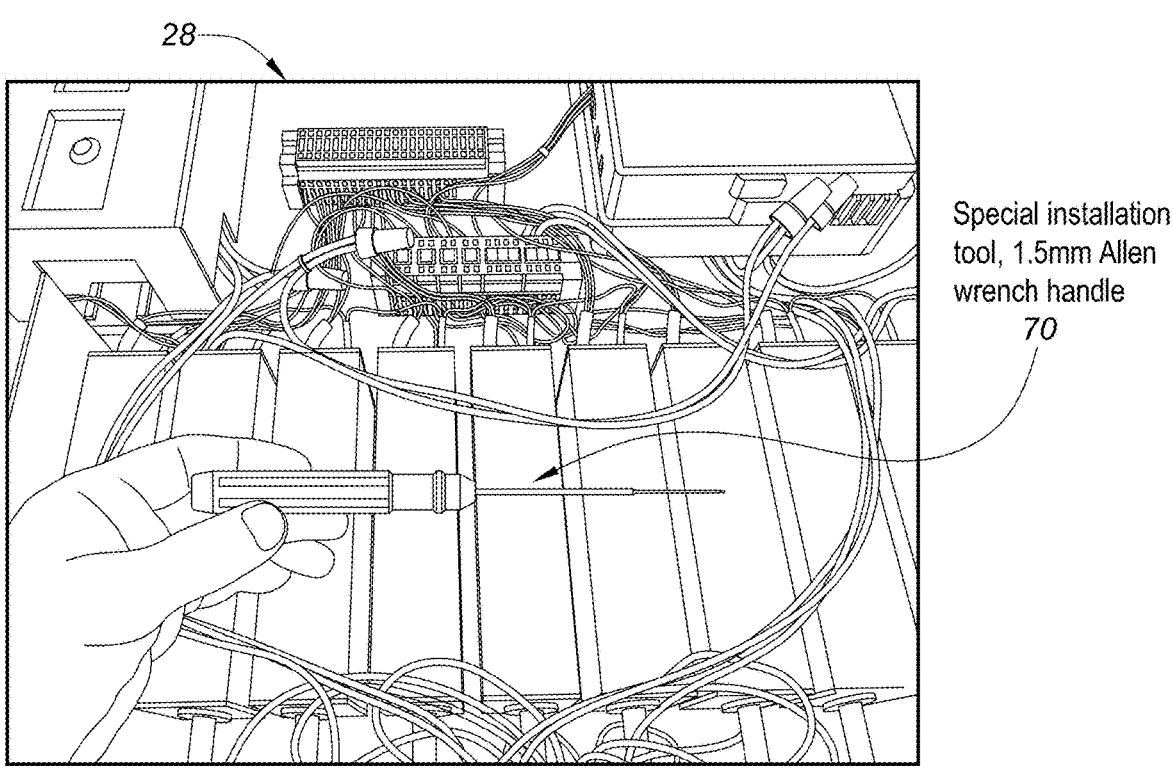
FIG. 2 illustrates an enlarged view of a portion of a remote driver control center and a special Allen wrench required to manipulate the terminal blocks for wire insertion.
Figure 3:
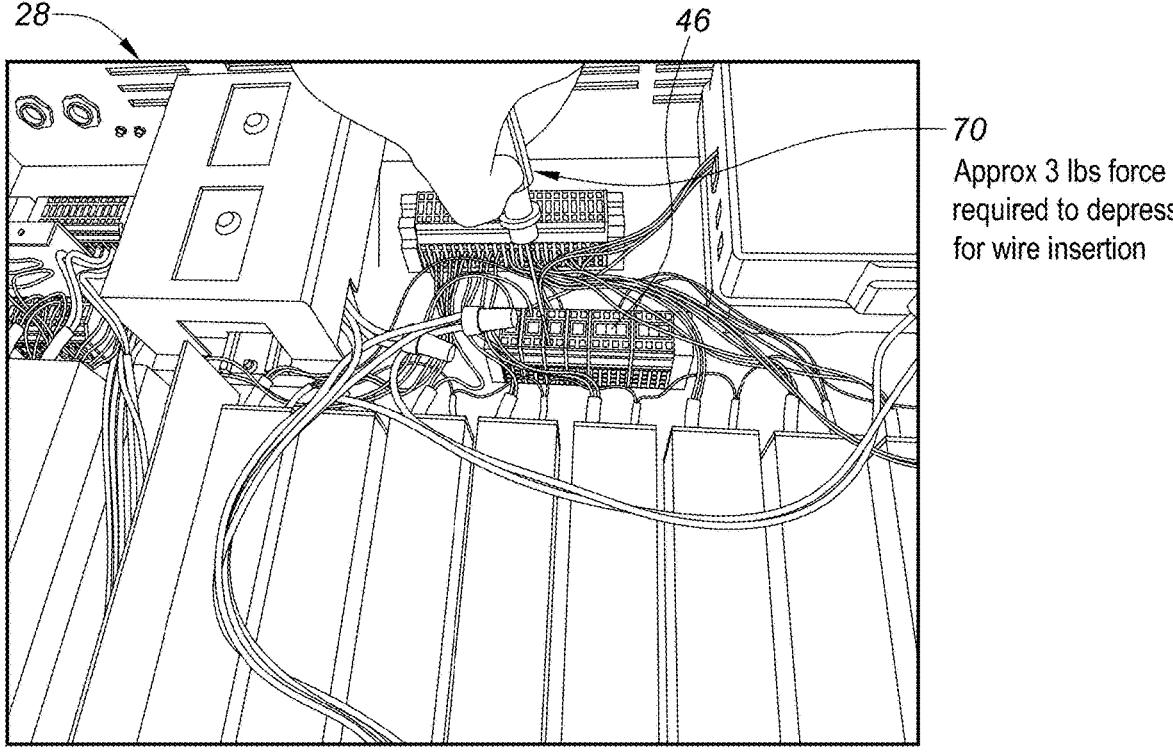
FIG. 3 shows the Allen wrench being used to depress one terminal of a terminal block for wire insertion or removal.
Figure 4:
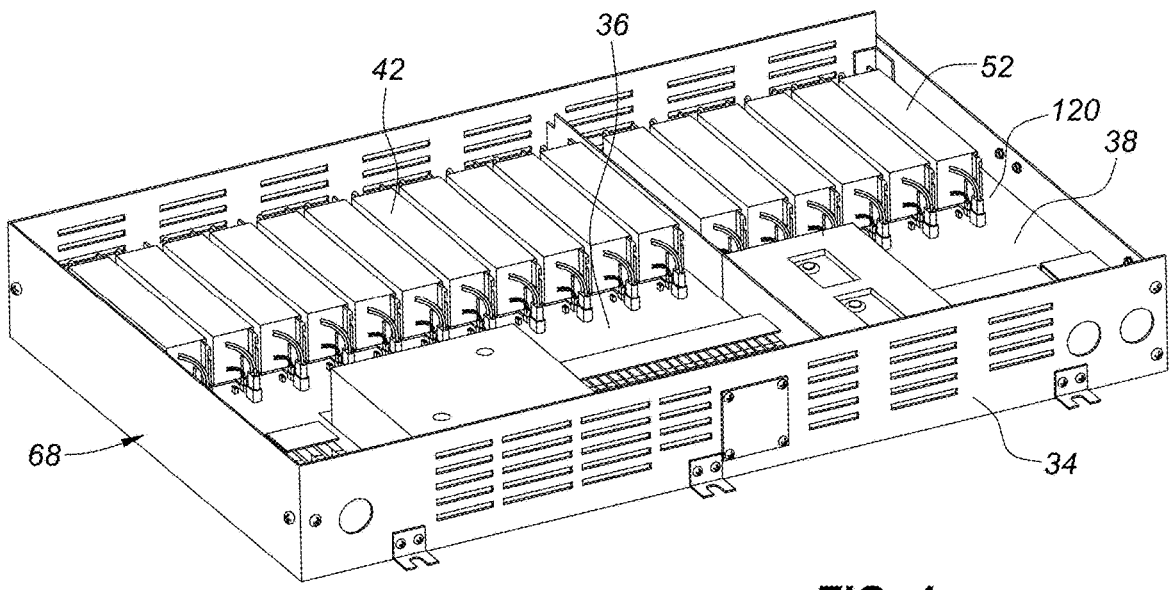
FIG. 4 is a top perspective view of a remote driver control center according to the present patent document.
Figure 5:
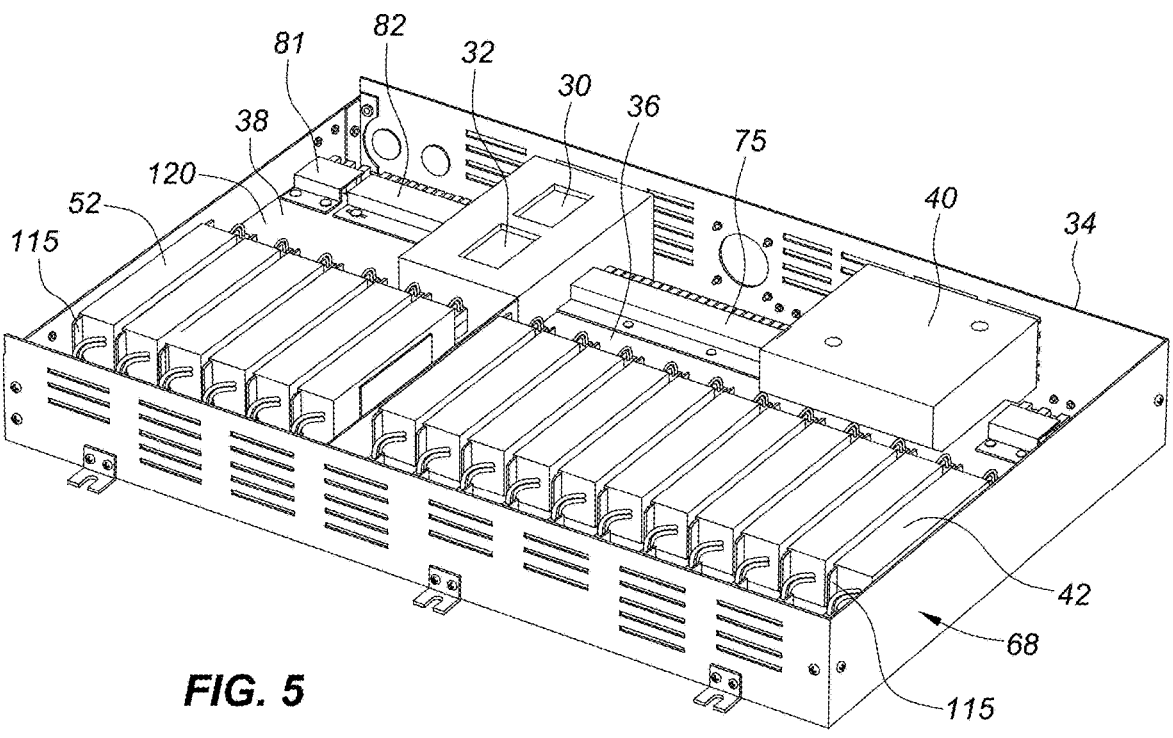
FIG. 5 is a bottom perspective view of a remote driver control center according to the present patent document.
Figure 6:
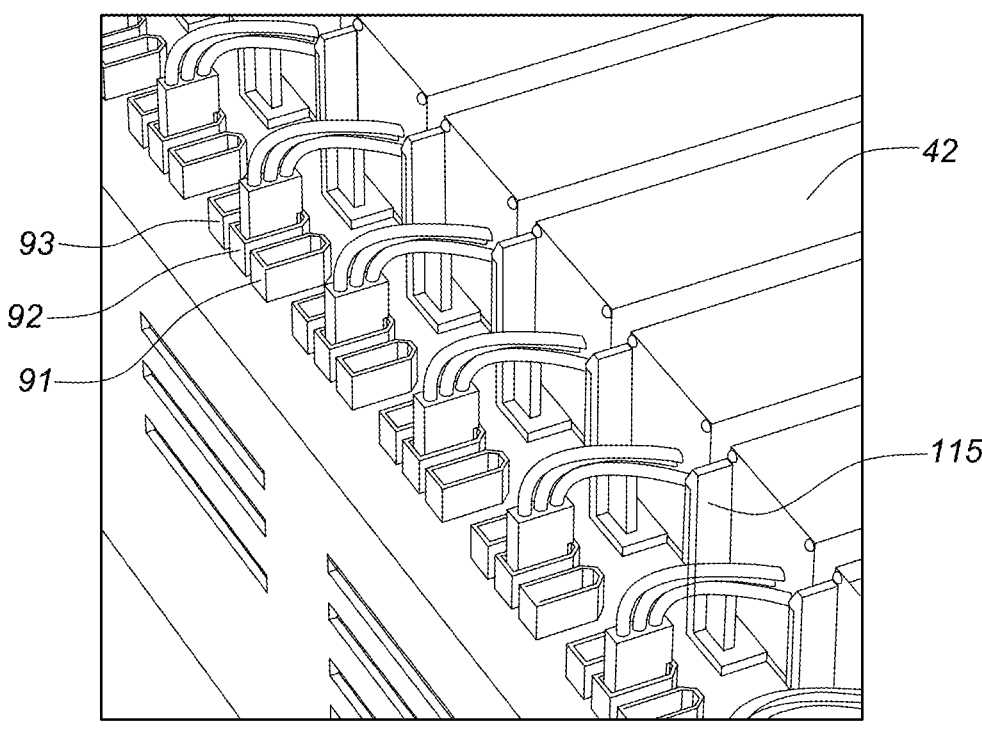
FIG. 6 is an enlarged view of the input power side of the normal power supplies of the remote driver controller illustrating that each power supply may be connected with a plug and socket connector to a load A, load B, or a load C circuit of the controller of the RDCC.
Figure 7:
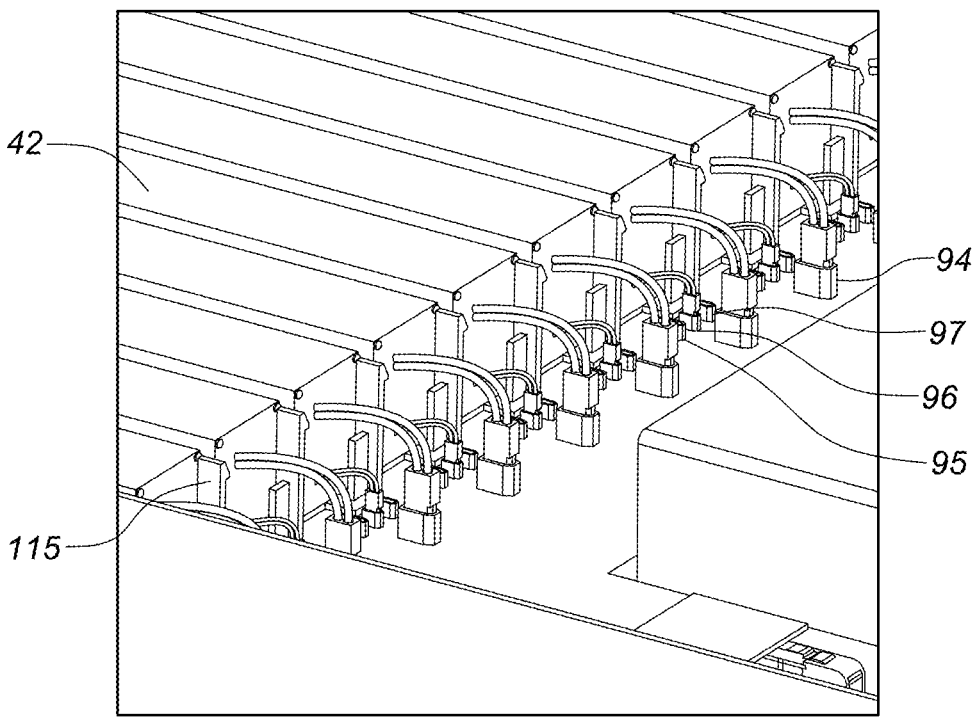
FIG. 7 is an enlarged view of the output power side of the normal power supplies of the remote driver controller illustrating that each power supply dimming input may be connected to a load A, load B, or load C dimming circuit of the RDCC controller using a standard plug and socket connector and that the DC output of each power supply is connected to a load specific connector.
Figure 8:
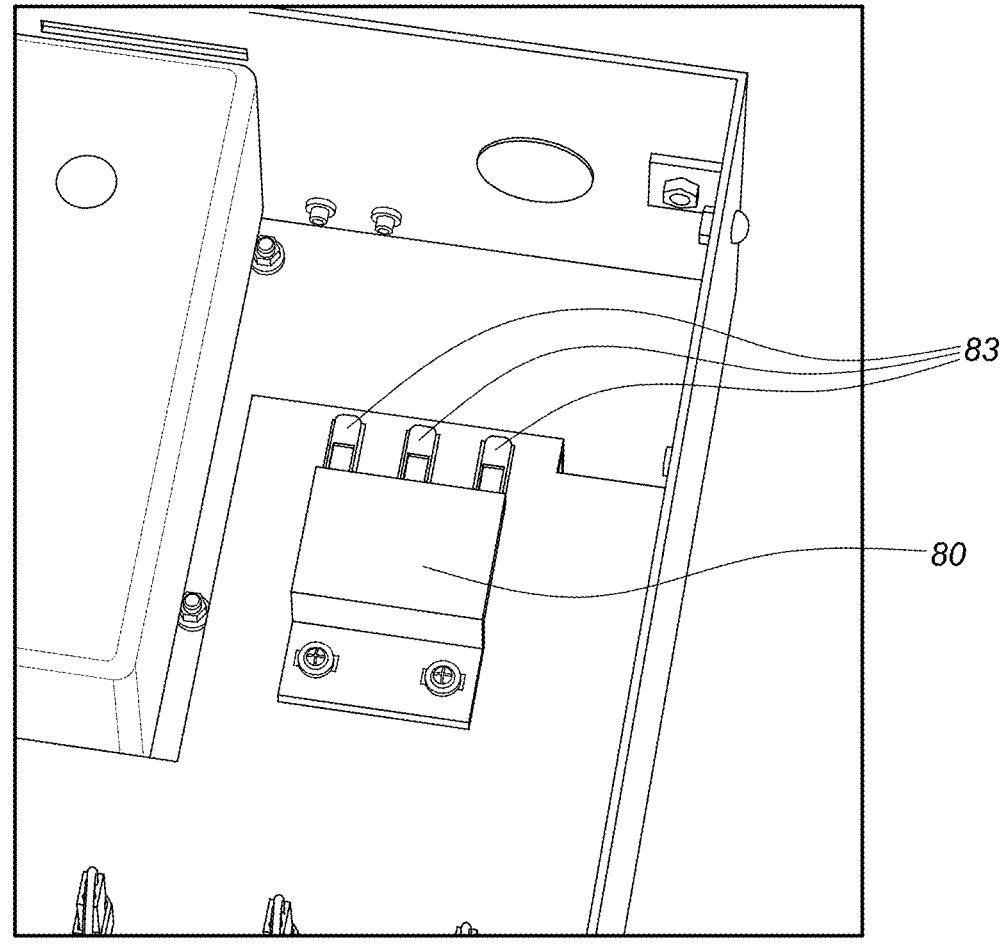
FIG. 8 shows an enlarged view of the tool-less in-line terminals used to replace the normal AC power distribution block 44 on the normal side of Applicant's first generation RDCC shown in FIGS. 1-3 in the RDCC according to the present embodiment.
Figure 9:
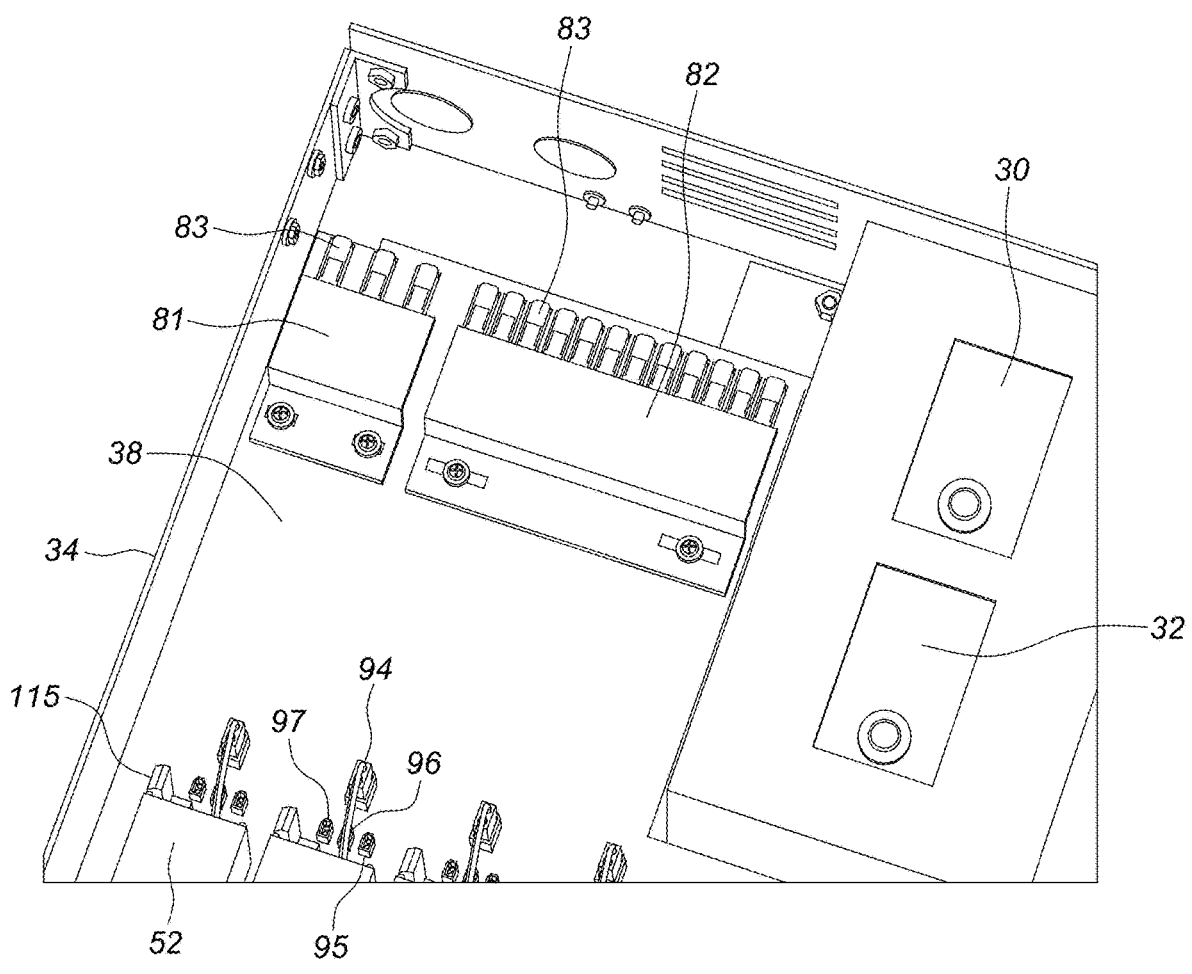
FIG. 9 shows an enlarged view of the emergency side of the RDCC of the present patent document, and more particularly showing the in-line splice connectors used to replace the emergency power distribution block 54.
Figure 10:
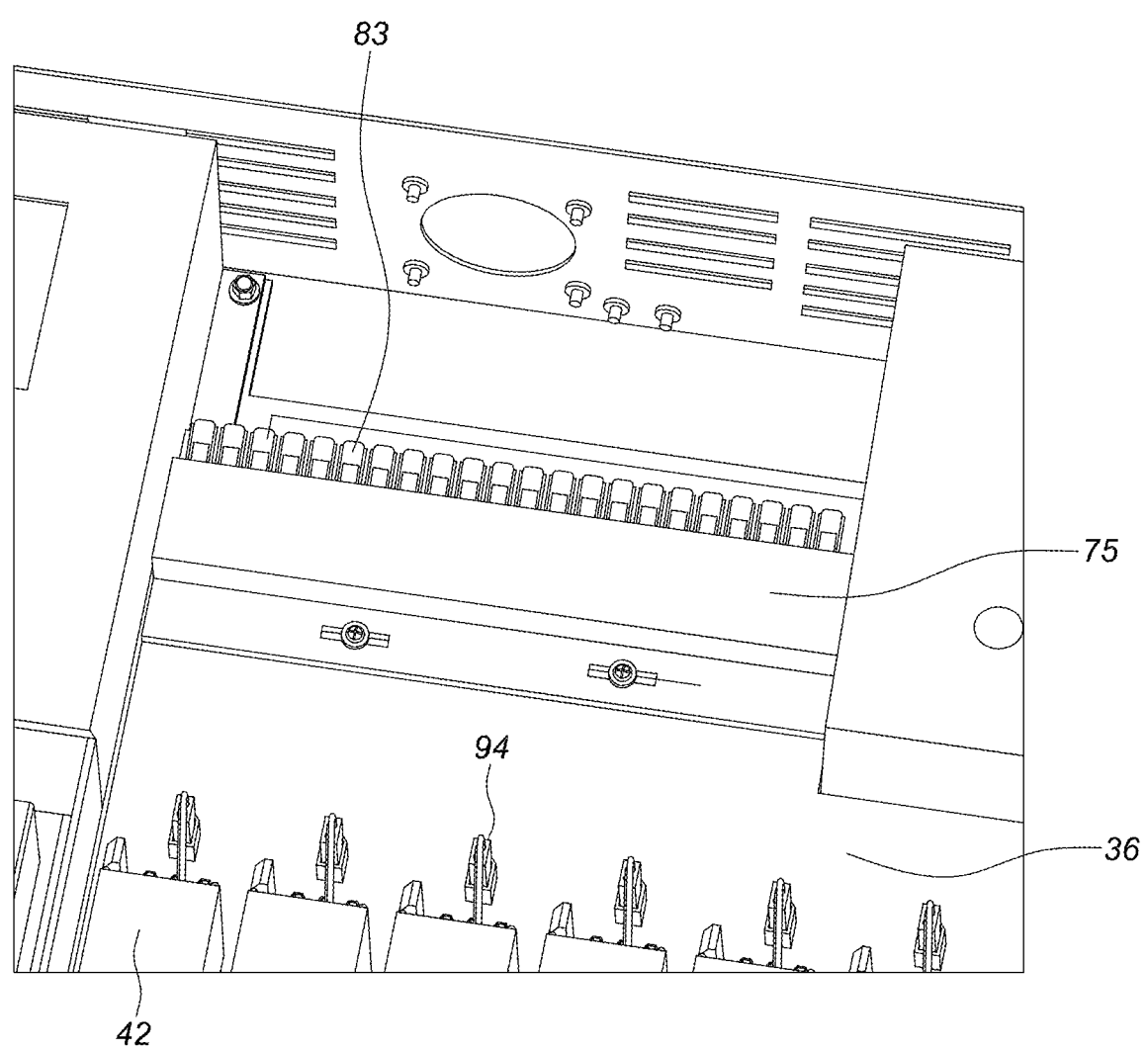

FIG. 10 shows an enlarged view of a portion of the normal power side of the RDCC of the present patent document, and more particularly showing the in-line splice connectors used to replace the normal power LED light fixture distribution block 50 of Applicant's first generation RDCC.

Figure 11:
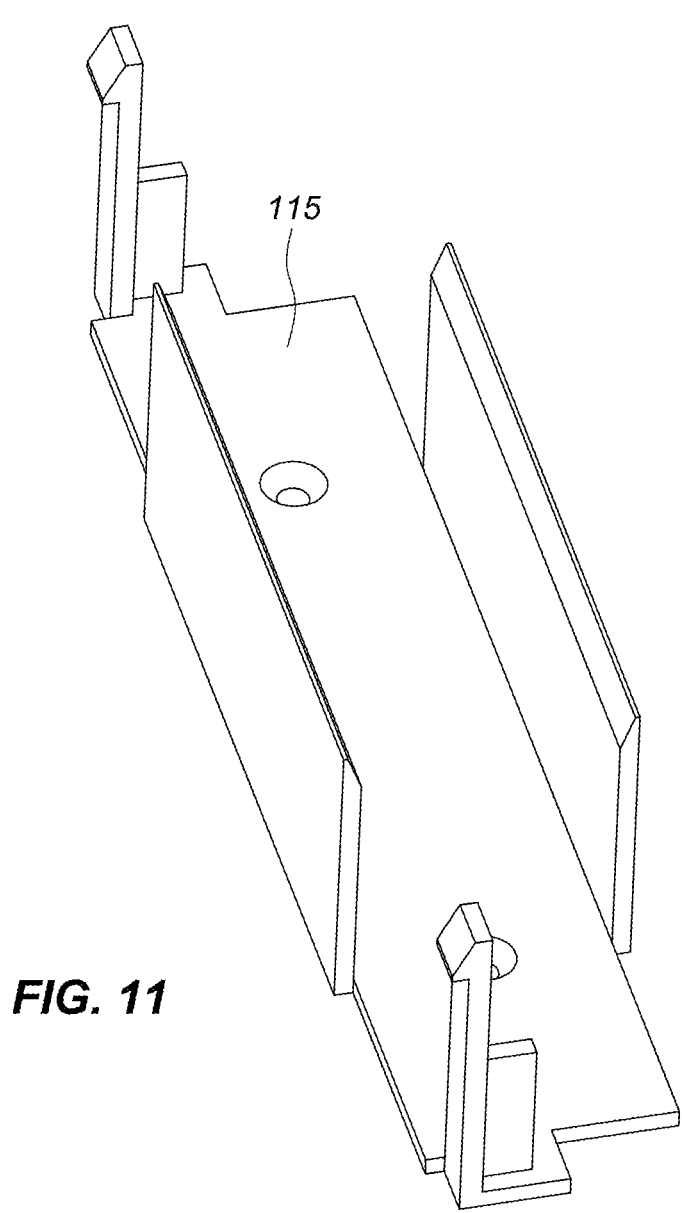

FIG. 11 shows a snap-in power supply holder that may be used in an embodiment of an RDCC according to the present patent document to permit tool-less removal and replacement of power supply drivers in the field and without powering down the RDCC.

Figure 12:
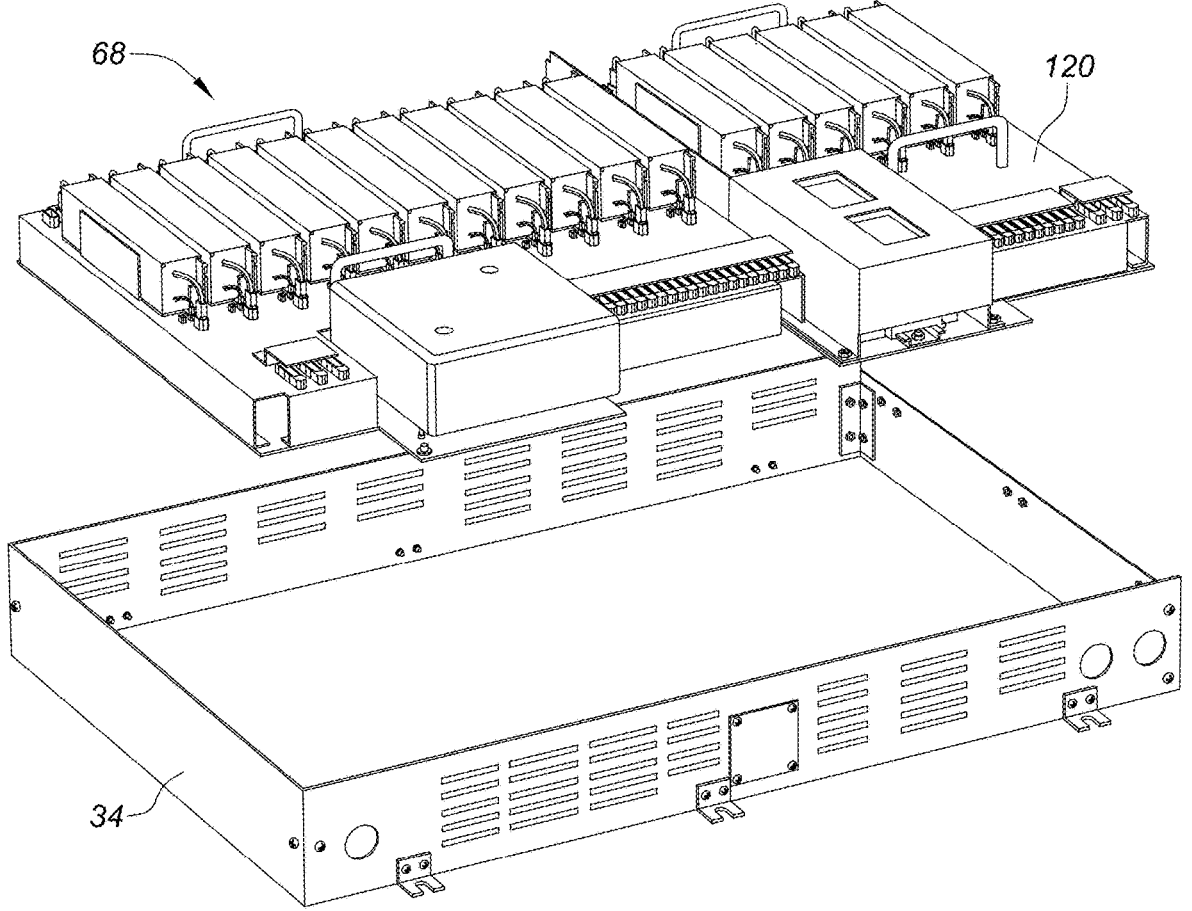

FIG. 12 illustrates a modular main tray that may be incorporated into an RDCC of the present patent document to permit easy removal and replacement of damaged housings and power supply drivers of the RDCC in the field.

Figure 13:
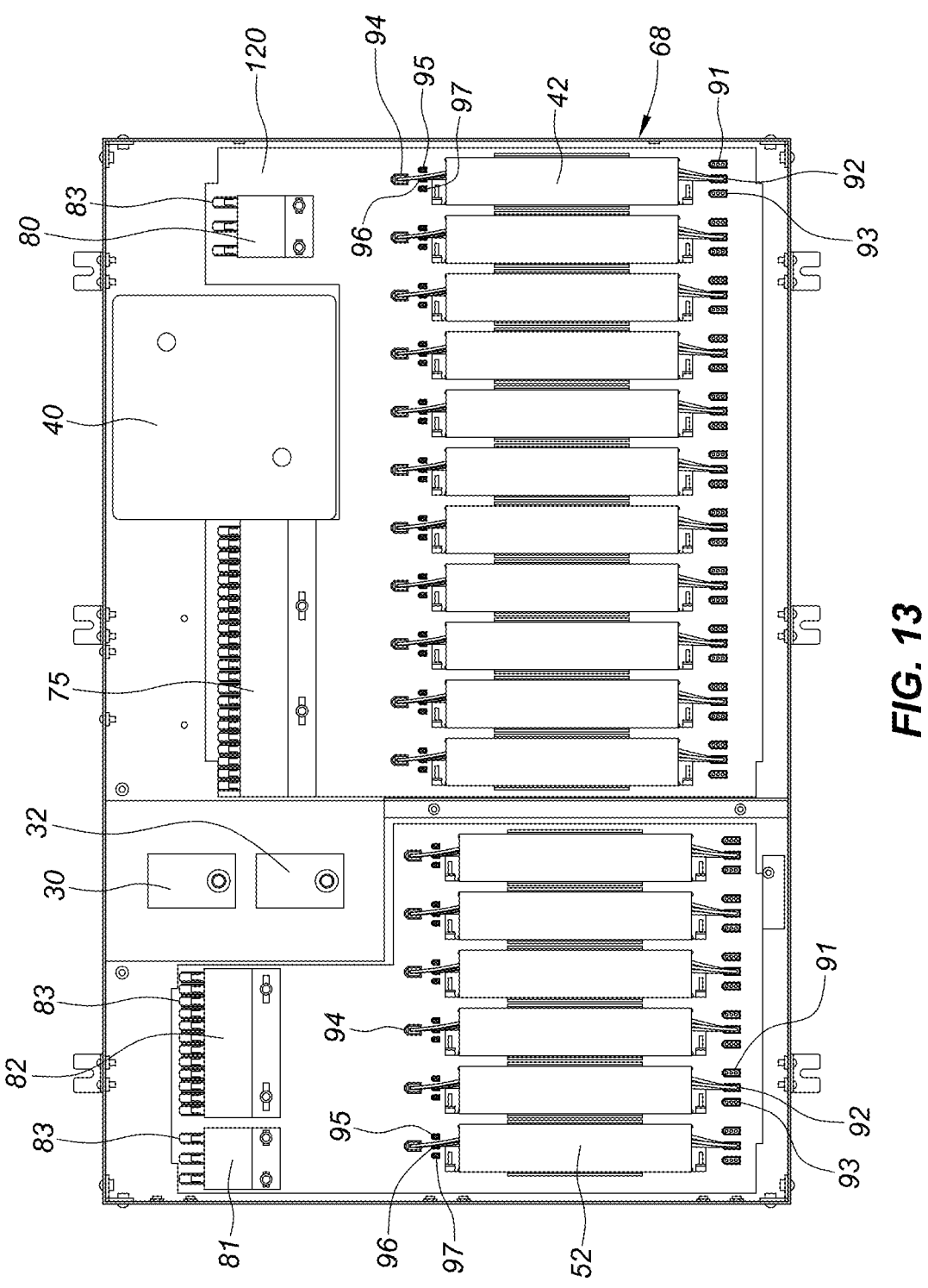

FIG. 13 is a front plan view of an RDCC according the present patent document with its front cover removed.

DETAILED DESCRIPTION

While it should be understood that the inventions described herein are described in connection with particular examples, the scope of the inventions are not limited to the specific examples. Rather, those skilled in the art will appreciate after reviewing the present disclosure that the following teachings can be used in a much wider variety of applications than the examples specifically mentioned herein.

Referring to FIG. 1-13 an RDCC with a standardized single manufacturing platform is provided. The RDCC according to the present patent document no longer requires specific manufacturing sequence prior to assembly of power supplies.

Modularity of power supplies eases burden of production oversight. Snap-in power supply mount (as best seen in FIG. 11) provides ease of production and field service, and a hot swappable system. As a result, there is no need to turn main power off for field service.

Load specific connectors at each power supply station (both on the normal and emergency power sides) provide ease of assignment during production, as well as in the field. Commonly available male/female (plug and socket) connectors provide ease of assembly and do not require any special tools, which is a distinct advantage in the field.

Load specific dimming wire connectors eliminates the need for cumbersome terminal block and prewiring decisions.

The arrangement also provides a single connection point for Light Engine connection.

In-Line splice connectors, such as the Wago 221-2411, are used to eliminate the need for AC input terminal blocks on both the normal and emergency inputs. These in-line splice connectors require no special tools during field electrical connection or factory assembly. These same splice connectors may also be used to replace all of the terminal blocks of the prior generation RDCC.

The double decker emergency side design of prior RDCCs is now single deck for easier to service and assembly.

A modular main tray (as best seen in FIG. 12) can be easily replaced if outer case is damaged or upgrade to future technology.

While various embodiments of an improved remote driver control center and its respective components have been presented in the foregoing disclosure, numerous modifications, alterations, alternate embodiments, and alternate materials may be contemplated by those skilled in the art and may be utilized in accomplishing the various aspects of the described inventions. Thus, it is to be clearly understood that the present description is made only by way of example and not as a limitation on the scope of any of the inventions that may be claimed.

I claim:

1. An improved modular remote driver control center for LED light fixtures comprising:

a. a case;

b. a modular tray, removably mounted within the case;

c. at least one snap in power supply holder mounted on a first surface of the modular tray;

d. an LED light power supply driver for powering at least one LED light fixture removably mounted in each snap in power supply holder; and e. a printed circuit board assembly disposed on a second surface of the modular tray opposite to the first surface; wherein f. the printed circuit board assembly includes a plurality of load in connectors and a load out connector for each power supply removably mounted on the tray; and g. each load in and load out connector extends through a corresponding hole provided in the tray adjacent the each power supply removably mounted on the tray.

2. An improved modular remote driver control center for LED light fixtures comprising:

a case;

a modular tray, removably mounted within the case;

a plurality of snap in power supply holders mounted on a first surface of the tray;

an LED light power supply driver for powering at least one LED light fixture removably mounted in each snap in power supply holder; and a plurality of load in connectors mounted on the tray adjacent the each LED light power supply driver so that a corresponding load in connector operably connected to the corresponding LED light power supply driver may be selectively plugged into one of the plurality of load in connectors mounted on the tray based on the desired load for powering the LED light power supply; and a load out connector mounted on the tray adjacent the LED light power supply driver so that a corresponding load out connector operably connected to the corresponding LED light power supply driver may be removably plugged into the corresponding load out connector.

\* \* \* \* \*